United States Patent
Das

(10) Patent No.: US 9,007,265 B2
(45) Date of Patent: Apr. 14, 2015

(54) USING DIELECTRIC SUBSTRATES, EMBEDDED WITH VERTICAL WIRE STRUCTURES, WITH SLOTLINE AND MICROSTRIP ELEMENTS TO ELIMINATE PARALLEL-PLATE OR SURFACE-WAVE RADIATION IN PRINTED-CIRCUITS, CHIP PACKAGES AND ANTENNAS

(75) Inventor: Nirod K. Das, Ledgewood, NJ (US)

(73) Assignee: Polytechnic Institute of New York University, Brooklyn, NY (US)

( * ) Notice: Subject to any disclaimer, the term of this patent is extended or adjusted under 35 U.S.C. 154(b) by 1243 days.

(21) Appl. No.: 12/651,539

(22) Filed: Jan. 4, 2010

(65) Prior Publication Data

US 2010/0201579 A1 Aug. 12, 2010

Related U.S. Application Data

(60) Provisional application No. 61/142,293, filed on Jan. 2, 2009.

(51) Int. Cl.
  *H01Q 1/38* (2006.01)
  *H05K 1/02* (2006.01)
  *H05K 1/03* (2006.01)

(52) U.S. Cl.
  CPC ............... *H01Q 1/38* (2013.01); *H05K 1/024* (2013.01); *H05K 1/0251* (2013.01); *H05K 1/0366* (2013.01); *H05K 2201/0191* (2013.01); *H05K 2201/0195* (2013.01); *H05K 2201/0281* (2013.01); *H05K 2201/10068* (2013.01)

(58) Field of Classification Search
  USPC .................... 343/700 MS, 846, 753, 872, 909
  See application file for complete search history.

(56) References Cited

U.S. PATENT DOCUMENTS

| 4,600,018 A | * | 7/1986 | James et al. ................... 607/154 |
| 6,114,997 A | * | 9/2000 | Lee et al. ............... 343/700 MS |
| 6,735,849 B2 | * | 5/2004 | Cheng et al. ..................... 29/600 |
| 6,906,674 B2 | * | 6/2005 | McKinzie et al. ............ 343/767 |

(Continued)

OTHER PUBLICATIONS

Wang, Wei-Jen, "Multilayer Printed Antennas with Biaxial Anisotropic Dielectric Substrates: General Analysis and Case Studies" Dissertation, Submitted in Partial Fulfillment of the Requirements for the Degree of Doctor of Philosophy (Electrical Engineering), Polytechnic University (Jan. 2002).
U.S. Appl. No. 12/649,032, titled, "Azimuth-Independent Impedance-Matched Electronic Beam Scanning from a Large Antenna Array Including Isotropic Antenna Elements", filed Dec. 29, 2009.

*Primary Examiner* — Dameon E Levi
*Assistant Examiner* — Hasan Islam
(74) *Attorney, Agent, or Firm* — John C. Pokotylo; Straub & Pokotylo

(57) ABSTRACT

Substrate arrangements useful for high-performance radio-frequency planar circuits and antennas eliminate excitation of parallel-plate or surface-wave radiations. By eliminating such radiation which escapes sideways through the substrates, the loss of valuable power carried away by these radiations can be avoided, and/or complications resulting from these radiations (e.g., in the form or electromagnetic interference, cross-talk between circuit components or poor signal integrity) can be avoided. A new type of substrate layer is embedded with thin conducting wires that are closely packed and oriented normal to the substrate layering. These conducting wires change the substrate behavior in a unique way. Such new substrate layers may be used in slotline/coplanar waveguide circuits and microstrip antennas to achieve high-performance radio-frequency operations.

9 Claims, 2 Drawing Sheets

(56) References Cited

U.S. PATENT DOCUMENTS

| | | | |
|---|---|---|---|
| 6,995,711 B2 * | 2/2006 | Killen et al. | 343/700 MS |
| 7,236,070 B2 * | 6/2007 | Ajioka et al. | 333/247 |
| 7,626,549 B2 * | 12/2009 | Channabasappa | 343/700 MS |
| 7,667,650 B2 * | 2/2010 | Tiezzi et al. | 343/700 MS |
| 7,692,588 B2 * | 4/2010 | Beer et al. | 343/700 MS |
| 7,710,324 B2 * | 5/2010 | Tatarnikov et al. | 343/700 MS |
| 8,077,092 B2 * | 12/2011 | Coupez et al. | 343/700 MS |
| 8,232,920 B2 * | 7/2012 | Ding et al. | 343/700 MS |
| 2010/0201592 A1 | 8/2010 | Das | |

* cited by examiner

USING DIELECTRIC SUBSTRATES, EMBEDDED WITH VERTICAL WIRE STRUCTURES, WITH SLOTLINE AND MICROSTRIP ELEMENTS TO ELIMINATE PARALLEL-PLATE OR SURFACE-WAVE RADIATION IN PRINTED-CIRCUITS, CHIP PACKAGES AND ANTENNAS

§0. RELATED APPLICATIONS

Benefit is claimed, under 35 U.S.C. §119(e)(1), to the filing date of U.S. provisional patent application Ser. No. 61/142,293 (referred to as "the '293 provisional"), titled "SUBSTRATE ARRANGEMENT EMPLOYING ARTIFICIAL DIELECTRIC SUBSTRATES, EMBEDDED WITH VERTICAL WIRE STRUCTURES, FOR USE WITH STRIPLINE, SLOTLINE AND MICROSTRIP ELEMENTS TO ELIMINATE PARALLEL-PLATE OR SURFACE-WAVE RADIATION IN PRINTED-CIRCUITS, CHIP PACKAGES AND ANTENNAS," filed on Jan. 2, 2009 and listing Nirod DAS as the inventor, for any inventions disclosed in the manner provided by 35 U.S.C. §112, ¶ 1. The '293 provisional application is expressly incorporated herein by reference. The scope of the present invention is not limited to any requirements of the specific embodiments described in the '293 provisional application.

§1. BACKGROUND OF THE INVENTION

§1.1 Field of the Invention

The present invention concerns eliminating or suppressing parallel plate or surface-wave radiations, particularly in the context of printed-circuits, chip packages and antennas. In particular, the present invention concerns providing an improved substrate arrangement employing a unidirectional conducting dielectric substrate to be used with slotline circuits and microstrip antenna designs so as to eliminate or greatly suppress parallel plate or surface-wave radiations.

§1.2 Background Information

Printed circuits have been developed and used for commercial and military applications during the past decades. Such printed circuits have provided significant benefits in microwave and antenna technologies. Printed elements physically require a dielectric substrate to connect to the rest of the circuit in a multilayered structure. For such dielectric-supported geometries, energy leakage occurs in the form of surface waves.

More specifically, designs commonly implemented today use conventional substrates that are uniform and isotropic in their electromagnetic characteristics. These substrates support one or more guided-wave modes, as dictated by fundamental electromagnetic theory. A circuit or antenna element fabricated on such a substrate would excite power into one or more of these guided modes which propagate along the substrate. As a result, valuable radio-frequency power is lost, making such designs inefficient. These guided radiations also create unwanted cross-talk between nearby circuits, introduce packaging resonances that may seriously affect the system performance, and/or create various electromagnetic interference problems that could seriously degrade signal integrity of the chip or system.

References directed to problems in printed circuits include: the article H.-Y. D. Yang, J. Wang "Surface Waves of Printed Antennas on Planar Artificial Periodic Dielectric Structures" *Antennas and Propagation, IEEE Transactions on*, Volume 49, Issue 3, (March 2001); and the reference J. H. Kim "Multilayer Printed Circuits With a Uniaxial Conducting Layer" Master Thesis, (January 2006, Polytechnic University of New York). Each of the foregoing references is expressly incorporated by reference.

It would be useful to reduce, and possibly eliminate, such surface waves and consequently, problems associated with such surface waves.

§2. SUMMARY OF THE INVENTION

At least some embodiments consistent with the present invention provide new substrate arrangements with which one can design high-performance radio-frequency circuits, chip packaging and communication antennas. Such embodiments eliminate (or greatly reduce) excitation of parallel-plate or surface-wave radiations that would otherwise critically limit the operation of high-performance radio-frequency circuits and antennas.

At least some embodiments consistent with the present invention provide a non-conventional substrate which is fabricated by embedding closely spaced, thin conducting wires (or some other conductors) into a conventional substrate. The "wires" are oriented normal to the substrate layering. This emulates a uniaxial conducting behavior not found in the typical substrate material commonly used in circuit fabrication. Such embedding of wires in the substrate might be achieved by mechanically reinforcing metal wires in the fabrication process of the substrate, or by implementing closely-spaced metal "via-holes" in the semiconductor manufacturing process.

§3. BRIEF DESCRIPTION OF THE DRAWINGS

§4. DETAILED DESCRIPTION

The present invention may involve novel substrate arrangements including unidirectional conducting substrates for use with slotline circuits and microstrip antenna to reduce or eliminate parallel-plate or surface-wave radiations. The following description is presented to enable one skilled in the art to make and use the invention, and is provided in the context of particular applications and their requirements. Thus, the following description of embodiments consistent with the present invention provides illustration and description, but is not intended to be exhaustive or to limit the present invention to the precise foam disclosed. Various modifications to the disclosed embodiments will be apparent to those skilled in the art, and the general principles set forth below may be applied to other embodiments and applications. For example, although a series of acts may be described with reference to a flow diagram, the order of acts may differ in other implementations when the performance of one act is not dependent on the completion of another act. Further, non-dependent acts may be performed in parallel. Also, as used herein, the article "a" is intended to include one or more items. Where only one item is intended, the term "one" or similar language is used. In the following, "information" may refer to the actual information, or a pointer to, identifier of, or location of such information. No element, act or instruction used in the description should be construed as critical or essential to the present invention unless explicitly described as such. Thus, the

Figure 1:
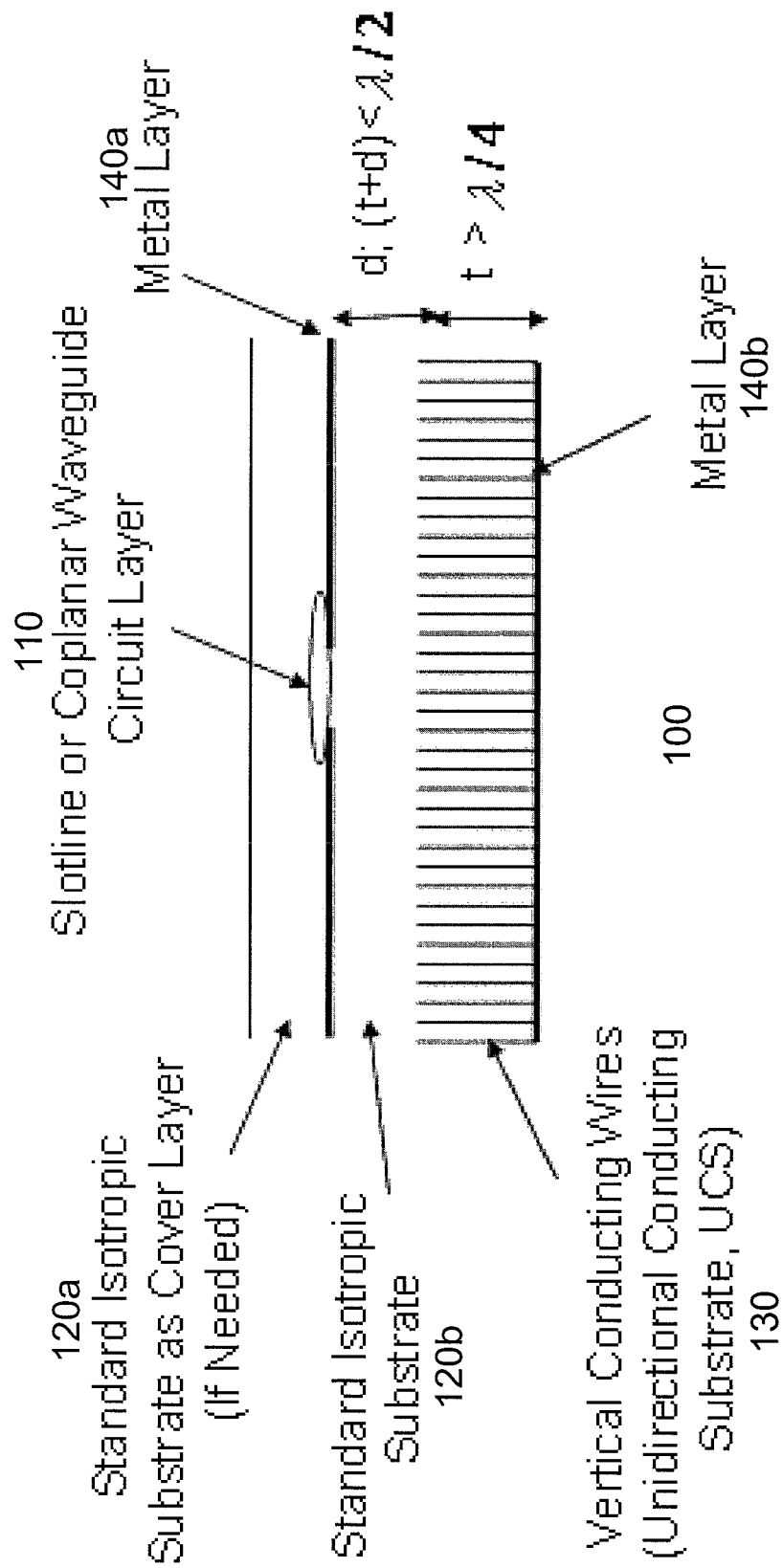
FIG. 1 illustrates a slotline or coplanar-waveguide design employing a unidirectional conducting substrate consistent with the present invention.

§4.1 Exemplary Substrate Arrangement in which a Slotline Circuit is Provided with a Unidirectional Conducting Substrate FIG. 1 illustrates a combination 100 including a slotline or coplanar waveguide circuit layer 110, standard isotropic substrates 120a (as a cover layer) and 120b, vertical conducting wire portion 130, and metal layers 140a and 140b.

In the simplest form, the substrate material used in the vertical conducting wire portion 130, and in which the conducting wires are embedded (the embedded substrate is referred to as unidirectional conducting substrate, or "UCS"), may be made out of the same material as the other two substrates 120a and 120b (referred to as conventional isotropic substrates). More generally, however, all three substrates may be made of the same materials, two different materials, or three different materials.

In the exemplary combination 100, where all three layers use the same substrate medium, the thickness t of the UCS layer 130 is larger than a quarter wavelength in the common substrate medium, and the total substrate thickness (t+d) is less than a half wavelength in the common substrate medium. In the general situation, when the layers are made of different substrate media, the thickness t of the UCS layer 130 is still to be larger than a quarter wavelength in its own substrate medium, whereas the total thickness is less than a half wavelength in the UCS substrate medium in the following equivalent sense.

Let the input wave impedance at the interface between the UCS layer 130 and the isotropic substrates 120b looking upwards, in the presence of the top metal layer 140a short circuit, be Z for wave propagation normal to the substrate interface. If $Z=j\eta \tan(kd')$ (where $\eta$ and $k$ are the wave impedance and wave number, respectively, in the UCS substrate medium 130), then d' is called the equivalent total thickness of the isotropic substrate layer 120b in the UCS substrate medium 130. In the exemplary combination 100, (t+d') is less than a half wavelength in the UCS medium.

In the exemplary combination 100, the UCS layer 130 is not in direct contact with the circuit 110 so that the primary performance of the circuit 110 is not negatively affected by the presence of the UCS 130. Therefore, the conventional design techniques needn't be significantly modified. The UCS layer 130 mainly affects the guided mode propagation, but does not affect the dominant circuit 110 characteristics. Advantageously, design tools and fabrication processes currently in use needn't be greatly altered in order to adapt to the new design modifications.

The cover layer 120a on top of the combination 100 is optional. Even if the cover layer 120a is needed as a thin protecting coating, this does not affect the design of the rest of the structure. As long as this layer is sufficiently thin, any possible problems due to guided surface mode in this layer are not a significant issue. Also, because this layer does not have any primary electrical function, a polymer foam type material can be used, which would behave almost like a free space. Consequently, the cover layer would have essentially no electrical effect on the circuit design.

Figure 2:
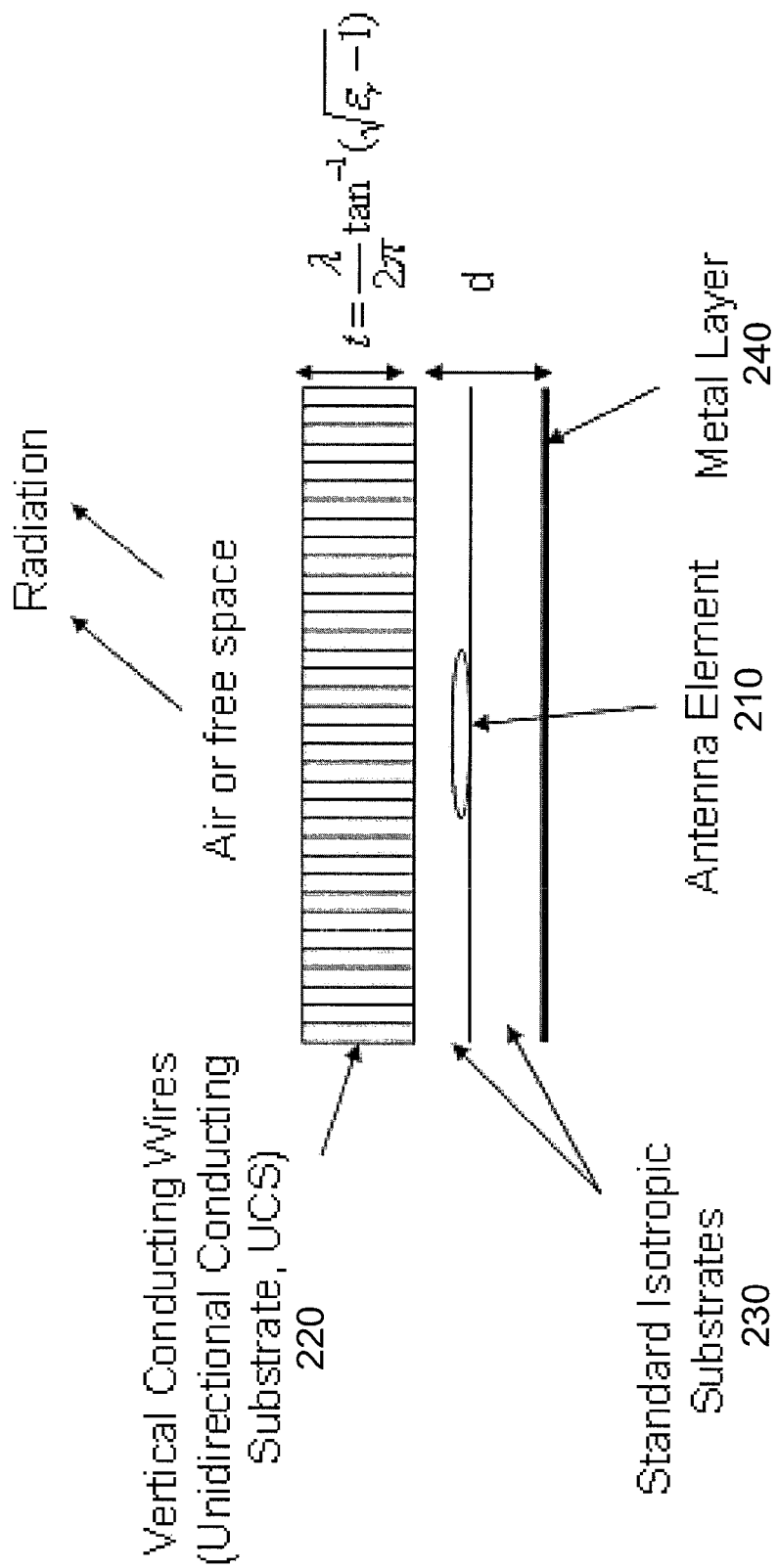
FIG. 2 illustrates a microstrip antenna design employing a unidirectional conducting substrate consistent with the present invention.

§4.2 Exemplary Substrate Arrangement in which a Microstrip Antenna is Provided with a Unidirectional Conducting Substrate FIG. 2 illustrates a combination 200 including an antenna element/layer 210, standard isotropic substrates 230, vertical conducting wire portion 220, and a metal layer 240.

The substrate configuration in this case is different from that of FIG. 1. The top medium is air or free space to allow radiation from the antenna to escape. The UCS layer 220 is spaced a bit from the antenna layer 210 (as in the circuit design of FIG. 1). This is useful because the antenna's near field is not substantially affected, thus keeping the antenna's reactance and resonant frequency mostly unchanged. It is preferable if the UCS layer 220 in this design is made out of a substrate with a low dielectric constant, such that the effect on radiation field is reduced.

In this design, it is seen that the dominant transverse magnetic (TM) surface-wave mode is still supported, but the design parameters can be adjusted such that the surface-wave is not excited by the antenna. This is possible by designing the UCS layer 220 such that the surface-wave propagation constant of the total structure is equal to the wave number of the bottom antenna substrate at the center frequency of operation. Under this condition, the surface-wave "sees" an equivalent short-circuit at the antenna plane, thus isolating the surface-wave from the antenna current. Accordingly, the surface-wave mode is not excited or coupled to the antenna. This is achieved only at the center frequency of the antenna operation, with only small excitation of the surface-wave outside the center frequency.

When the two isotropic substrates 230 are made of the same material with relative dielectric constant $\in_r$, and the UCS layer is made of a low-dielectric constant foam substrate, the design thickness t in FIG. 2 can be shown to be equal to $\lambda/(2\pi)\tan^{-1}(\sqrt{\in_r-1})$, where $\lambda$ is the wavelength in the free-space medium. In this case, the design of thickness t of the UCS layer 220 is independent of the design of the total thickness d of the isotropic substrates, as long as d is not too large to support other higher-order modes. That is, the design would work for a wide range of substrate thickness d. For a general design, when the isotropic substrates below and above the antenna element are made of different materials, the design formula will have to be adjusted accordingly.

The embedded wires in the UCS layer 220 of FIG. 2 significantly affect propagation of the TM mode, but do not alter the transverse electric (TE) waves. Further, the UCS substrate is selected with a low dielectric constant and, therefore, it will behave almost like a free-space medium for the TE waves. Accordingly, the TE waves would not "see" the UCS layer 220. Consequently, the TE wave propagation is determined only by the isotropic substrates 230, the total thickness of which is usually not too large to support a TE surface-wave mode. In other words, the UCS layer 220 is designed to alter only the dominant TM surface-mode behavior, while not altering the propagation of the TE waves and not introducing new TE surface modes. This unique physical behavior, which is not seen in conventional substrates, allows significant flexibility to design over a wide range of operating parameters.

§4.3 Refinements and Alternatives

The wires in the wire substrate portion may be any good conductor, such as copper, aluminum, gold, etc. As an alternative, conducting polymer materials, synthesized by suitably aligning conducting polymer chains, may be used.

Other portions of the combinations 100 and 200 may use conventional materials, and elements operating conventionally (such as described in the references listed in section 1.2 above).

What is claimed is:

1. Antenna circuit combination comprising:
   a) a metal layer;
   b) a first isotropic substrate provided on the metal layer and having a dielectric constant $\in_r$;

c) a second isotropic substrate provided adjacent to the first isotropic substrate and having a dielectric constant $\in_r$;

d) an antenna element provided between the first substrate and the second isotropic substrate, the antenna having an operating wavelength λ; and e) a third substrate provided above the antenna element, defining a plane, and embedded with thin conducting wires that are closely packed and oriented normal to the plane defined by the third substrate, wherein a volume defined between the second substrate and the third substrate and extending from the second substrate to the third substrate has no intervening conducting material, and wherein a thickness t of the third substrate is substantially equal to $\lambda/(2\pi)\tan^{-1}(\sqrt{\in_r-1})$.

2. The antenna circuit of claim 1 wherein the thickness t of the third substrate is independent of a total thickness d of the first and second isotropic substrates.

3. The antenna circuit combination of claim 1 wherein the third substrate is made of a material having a dielectric constant close to free-space.

4. The antenna circuit combination of claim 3 wherein material having a dielectric constant close to free-space is a foam material.

5. A circuit combination having an operating wavelength λ, the circuit combination comprising:

a) a first metal layer;

b) a first substrate, having a thickness t, defining a plane, and embedded with thin conducting wires that are closely packed and oriented normal to the plane defined by the first substrate, the first substrate being provided adjacent to the first metal layer;

c) a second metal layer provided with a slotline or coplanar waveguide circuit, wherein the thickness t of the first substrate is at least one-quarter λ in the first substrate, wherein an equivalent distance d' between the thin conducting wires of the first substrate and the second metal layer is non-zero, but less than one-half λ in the first substrate, less the thickness t of the first substrate, thereby electrically isolating the thin conducting wires from the second metal plate, wherein the equivalent distance d' can be derived using a known input wave impedance Z, wherein Z=jη tan(kd'), wherein η is the wave impedance in the first substrate, and wherein k is the wave number in the first substrate.

6. A circuit combination having an operating wavelength λ, the circuit combination comprising:

a) a first metal layer;

b) a first substrate, having a thickness t, defining a plane, and embedded with thin conducting wires that are closely packed and oriented normal to the plane defined by the first substrate, the first substrate being provided adjacent to the first metal layer; and c) a second metal layer provided with a slotline or coplanar waveguide circuit, wherein the second metal layer is separated from the first substrate by a second substrate having an actual thickness d, wherein the second substrate is a standard isotropic substrate, wherein the thickness t of the first substrate is at least one-quarter λ in the first substrate, wherein a total equivalent thickness (t+d') of the first substrate and the second substrate is less than one-half λ in the first substrate, wherein d' represents an equivalent thickness of the second substrate layer with respect to the first substrate layer, wherein the first substrate and the second substrate are made of different materials, wherein the equivalent thickness d' of the second substrate can be derived using a known input wave impedance Z, wherein Z=jη tan(kd'), wherein η is the wave impedance in the first substrate, and wherein k is the wave number in the first substrate.

7. The circuit combination of claim 6 wherein the first substrate and the second substrate are made of the same material, and wherein the actual thickness d and the equivalent thickness d' of the second substrate are equal to each other.

8. The circuit combination of claim 6 further comprising:

(d) a third substrate adjacent to the second metal layer, provided as a protective cover layer, wherein the third substrate is sufficiently thin to avoid problems due to guided surface mode, and wherein the protective cover layer has minimal electrical effect on the circuit design.

9. The circuit combination of claim 6 further comprising:

(d) a plurality of substrate layers adjacent to the second metal layer, provided as protective cover layers, wherein the plurality of substrate layers are sufficiently thin to avoid problems due to guided surface mode, and wherein the protective cover layers have minimal electrical effect on the circuit design.

\* \* \* \* \*